United States Patent [19]
Fischer et al.

[11] Patent Number: 5,473,633
[45] Date of Patent: Dec. 5, 1995

[54] PROCESS AND A SYSTEM FOR DIGITAL MODULATION

[75] Inventors: Horst-Dieter Fischer, Unterhaching; Helmut Bittner, München, both of Germany

[73] Assignee: Deutsche Aerospace AG, Germany

[21] Appl. No.: 42,269

[22] Filed: Apr. 2, 1993

[30] Foreign Application Priority Data

Apr. 2, 1992 [DE] Germany .................... 42 10 966.3

[51] Int. Cl.⁶ ............................ H03K 7/08; H03K 9/08
[52] U.S. Cl. .................. 375/238; 375/295; 375/239; 327/31; 332/109; 332/112; 370/8; 370/9
[58] Field of Search .................... 375/22, 23, 59, 375/21, 237, 238, 239, 295; 307/234; 332/109, 112; 328/111; 364/459; 370/8–10

[56] References Cited

U.S. PATENT DOCUMENTS

| | | | |
|---|---|---|---|
| 4,001,728 | 1/1977 | Schneider | 375/22 |
| 4,138,632 | 2/1979 | Pauwels et al. | 375/22 |
| 4,646,321 | 2/1987 | Berlinsky | 275/22 |
| 5,042,752 | 8/1991 | Surauer et al. | 364/459 |

Primary Examiner—Stephen Chin
Assistant Examiner—Amanda T. Le
Attorney, Agent, or Firm—Evenson, McKeown, Edwards & Lenahan

[57] ABSTRACT

A digital modulation process and apparatus for converting an input signal comprising a time variable series of sampling values, each of which sampling values remains constant within a fixed sampling period, into output signals representing a sequence of positive and/or negative pulses having a constant amplitude and a variable pulse width and frequency. The input signal and modulator parameters are supplied to a data processor. In order to reduce computing expenditures and at the same time achieve an increase in precision, by means of the computing system, the switch-on and switch-off points in time $t_{se}$, $t_{sa}$ of the pulses as well as their operational signs are computed in one operation directly for each sampling period $\Delta t_k$.

16 Claims, 4 Drawing Sheets

PROCESS AND A SYSTEM FOR DIGITAL MODULATION

BACKGROUND AND SUMMARY OF THE INVENTION

This invention relates to a digital pulse modulation process, and to a digital pulse modulator and a control system using such a modulator.

Many control devices, such as flow control valves, reaction engines, proportioning mechanism, temperature control switches, three-position switching elements, magnet coils, and the like, which are to be used in control processes and systems, conventionally have only the function states ON/OFF in order to provide an inexpensive and reliable construction or to eliminate undesirable leakage losses. In order to generate an output quantity having a time average which follows a given time-variable input control guide signal, such control devices must be driven by means of pulses having a pulse width, pulse frequency and/or pulse-time range which bears a defined relationship to the input control and, in particular, is directly proportional to it.

Various types of modulators are normally used to convert such a control signal into an equivalent pulse sequence; these include pulse width modulators, pulse frequency modulators, pulse width - pulse frequency modulators (PWPF) or pseudo - rate modulators. For technical applications in closed control loops, not only the type of the pulse sequence and its proportionality to the input signal, but also its phase relationship with the control signal, are critical because the stability and dynamic behavior of a control loop, and thus the quality of the control operation, are substantially dependent on it. It is known that all physical systems which occur in practice ("controlled systems") have an inherent delay phenomenon, (that is, their output response has a negative phase angle rotation relative to their input signal conditions). In those instances where the above-mentioned types of control elements are used to control systems with significant delays, the most advantageous processes for conversion of the control signals are those which generate a positive phase angle rotation (that is, the fundamental component contained in the output pulse pattern has an inherent phase advance relationship with respect to the input signal).

In particular, so-called pseudo-rate modulators which generate an output signal that is proportional not only to the time variable amplitude of the input signal, but also to its rate of change (pseudo rate) have such favorable characteristics. When other types of modulators are used, in order to achieve comparable stability characteristics in a control loop, additional controller networks must be used to generate a phase advance relationship (positive phase angle); such measures, however, would cause a deterioration of the signal-to-noise ratio and would cause additional implementation expenditures.

Recently, digital controllers have been used increasingly for this purpose, so that the use of digital modulators is also considered desirable. The favorable lead-generating characteristics of a pseudo-rate modulator are thus particularly advantageous because additional phase losses are created by the unavoidable use of sample and hold elements; by delay times in the digital computers which may replace the controller networks; as well as by input and output delays, and the like. Such phase losses may have disadvantageous effects on the stability and dynamics of the associated control loops.

Although the simulation of the function elements of an analog pseudo-rate modulator in a digital arithmetic unit is possible in principle, it requires extremely short computing cycles in order to assure a dynamic response that corresponds to that of an analog modulator. A practical comparison of the function characteristics for typical applications shows that cycle rates of from 1 to 2.5 kHz would be necessary to process the modulator routines; that is, sampling rates which are approximately 20 to 50 times higher than for the control loop algorithms would be required, which would result in a correspondingly high load on the process computers and in an undesirable occupancy of the highest priority levels for the computing operations.

U.S. Pat. No. 4,599,697 discloses a satellite attitude control arrangement based on the use of a digital PWPF modulation, which utilizes a process of the initially mentioned type. The satellite itself constitutes the controlled system, with the controlled quantities being attitude angles about the three satellite axes. Measuring devices in the form of earth and sun sensors as well as gyros measure the actual values of the attitude angles and angular velocities. Based on these values, a controller determines deviations from pre-determinable desired values and generates error signals in the form of a series of digital sampling values, which values remain constant within each individual sampling period but vary over time—that is, the series of sampling values varies with respect to time.

This system uses a digital PWPF modulation process to convert input error signals into output signals in the form of a sequence of positive and/or negative pulses which have a constant amplitude and a variable pulse width and frequency. This is a simulation process in which each sampling period is divided into a fixed time slot pattern, and the modulator output signals are computed at uniform intervals. In each case, these computations occupy a portion of the sampling period, and the computed pulse sequence is retrieved in the next sampling period and is used to control the control elements, such as attitude control jets, which furnish discrete control pulses in order to maintain the satellite attitude angles at the desired values.

One disadvantage of this known simulation process is that, because of the fixed time slot pattern for each sampling period, the real temporal switching points of the analog modulator whose behavior is to be expressed digitally, are not precisely duplicated. In addition, excessively high computing expenditures are required because many computing cycles are completed between switching points, during which time the simulated output signal does not change. These disadvantages are interrelated in that although the precision in the timing of the switching point may be enhanced by means of a narrower nesting of the time-slot pattern, such a modification also results in an increase of the number of computing cycles per sampling period. Hence, the computing expenditures will rise at the same time, and vice versa.

It is therefore an object of the present invention to provide a digital modulation process which reduces computing expenditures, and at the same time increases the precision in the timing of the switching points. In addition, a digital modulator is to be provided for carrying out a process of this type as well as a control system using such a digital modulator.

These and other objects and advantages are achieved according to the invention by computing the switch-on and switch-off points of the pulses, as well as their operational signs, directly in one operation for each sampling period.

According to the invention, the computation (operating cycle) to be carried out at the start of each new sampling period takes place at a very high speed within a time that is very short relative to the duration of the sampling period, so that the complete pulse sequence that is applicable to the current sampling period is available from the beginning. In this manner unnecessary computing expenditures for the computation of conditions between switching points are eliminated and only those points in time are determined at which pulses are to be switched on and off as well as the operational signs which are in each case required for the pulses to be switched on. The computations are carried out in a computing system which comprises arithmetic units, memories and comparators. In addition to the input signals which represent the digitized error signals, modulator parameters which characterize the analog modulator are also supplied to the computing system. The algorithm according to which the processing takes place in the computing system will, of course differ depending on the type of modulator that is to be digitally implemented.

The principal advantage of the process according to the invention is that it permits highly precise computation of the temporal switching points, while at the same time it reduces overall computing expenditures in comparison to the known simulation process. The output signals of the computing system can be stored until the whole pulse sequence that is to be assigned to a sampling period is available. The readout from this memory may then take place with an arbitrary precision with respect to the clock frequency to be used.

In one embodiment of the invention, operation of a pseudo-rate modulator is to be digitally implemented by the process according to the invention. As mentioned above, such a modulator (as well as the respective variant of the process according to the invention) has characteristics which generate a phase advance. Also in the case of this variant, the advantage is naturally obtained that, within one operating cycle, only as many computing cycles are required as the number of switch-on and switch-off points which the corresponding sampling period would have in the case of an analog implementation of the modulator. In the case of a digital implementation of a modulator of the PWPF-type (or of another type), the switch-on and switch-off points as well as their operational signs would have to be computed analogously, specifically on the basis of the mathematical formulae characterizing the respective modulator type. However, by means of modulator versions which differ from the pseudo-rate type, the desired phase lead cannot be achieved in the same manner.

Other objects, advantages and novel features of the present invention will become apparent from the following detailed description of the invention when considered in conjunction with the accompanying drawings.

DETAILED DESCRIPTION OF THE DRAWINGS

Figure 1:
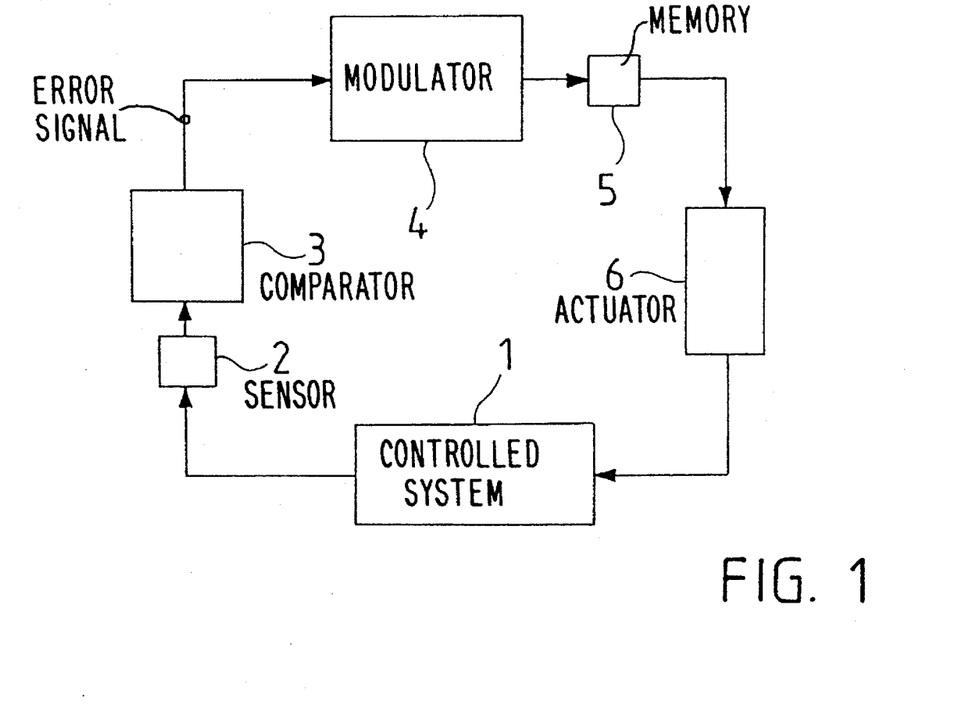
FIG. 1 is a schematic block diagram of a control system comprising a digital modulator according to the invention.

FIG. 1 illustrates a control system which is used for attitude control of a satellite 1 whose orientation in space is to be stabilized. That is, the attitude angles of the satellite 1 about its satellite-fixed coordinate axes must be maintained at predeterminable desired values. For this purpose, measuring unit 2 measures the attitude angles (and possibly also the angular velocities) of the satellite about the axes. These measured quantities are supplied to a controller 3 where deviations from desired values are determined and error signals are generated based on control specifications adapted to the individual case. These error signals may be continuously variable but, in the case of a digital control, are emitted as a series of discrete sampling values which vary over time, although each value is constant within an individual sampling period.

The error signals are fed as input signals, to a modulator 4 which generates output signals in the form of a sequence of discrete, positive and/or negative pulses which have a constant amplitude and variable pulse width and frequency. After an intermediate storage in a memory 5 (if necessary), these output signals are used to control a control device 6, for example, attitude control jets or reaction wheels on board the satellite, which emits control pulses to the controlled system 1. As a result, the controlled quantities (in this case, the above-mentioned attitude angles) are maintained at the desired values.

Figure 2:
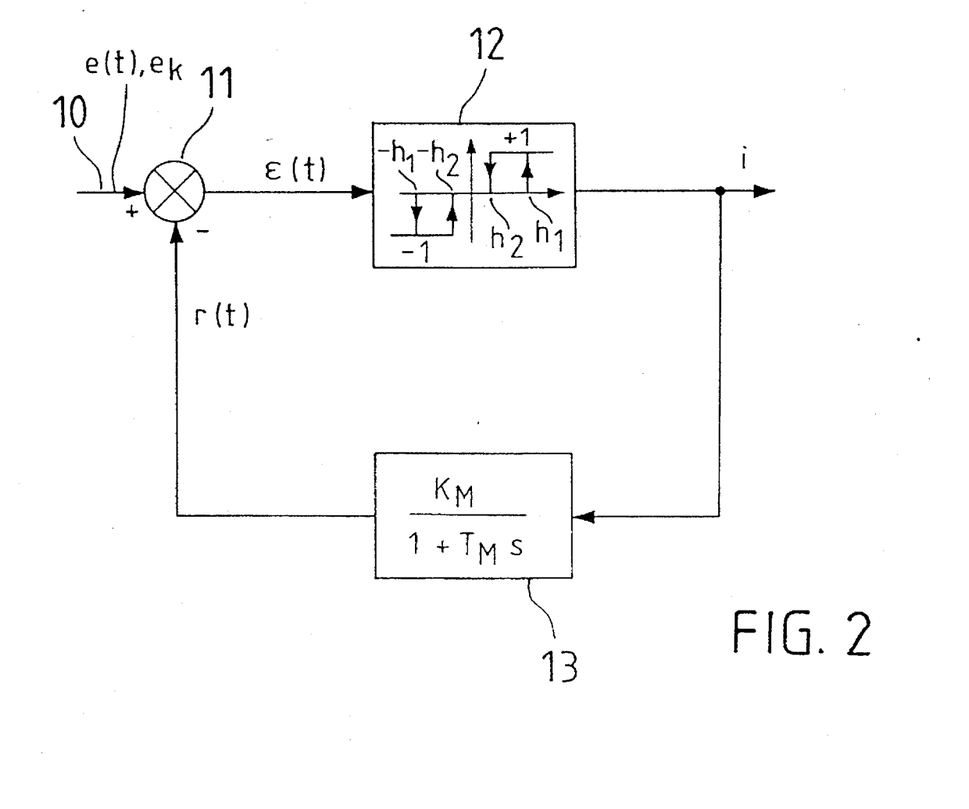
FIG. 2 is a schematic block diagram of an analog pseudo-rate modulator.

FIG. 2 shows an operational diagram of a pseudo-rate modulator which comprises a three-state hysteresis element 12 in the forward branch and a first order linear delay element 13 in the feedback branch. The feedback signal r(t) is subtracted from an input signal e(t) in a summation element 11, and the resulting difference signal $\epsilon(t)$ is applied to the input of the hysteresis element 12 which has the switch-on thresholds $\pm h_1$ and the switch-off thresholds $\pm h_2$. Hysteresis element 12 in turn emits the output signal i=0 or i=±1, according to the instantaneous value of $\epsilon(t)$ and its "history" in a known manner. The output signal i is fed back by way of the delay element 13, which has an amplification factor $K_M$ and a time constant $T_M$, and arrives at the summation element 11 as feedback signal r(t). In the case of a digital modulator, an input signal $e_k$, which is constant during each sampling period $\Delta t_k$, is present at the input.

The modulator illustrated in FIG. 2 is of the pseudo-rate type since the delay element 13 is provided in the feedback branch. As mentioned above, such a pseudo-rate modulator (in a frequency range that is a function of parameters $K_M$ and $T_M$) generates an output signal which has a phase advance relationship with respect to the input signal, a characteristic which is particularly desirable in the present case.

Figure 3:
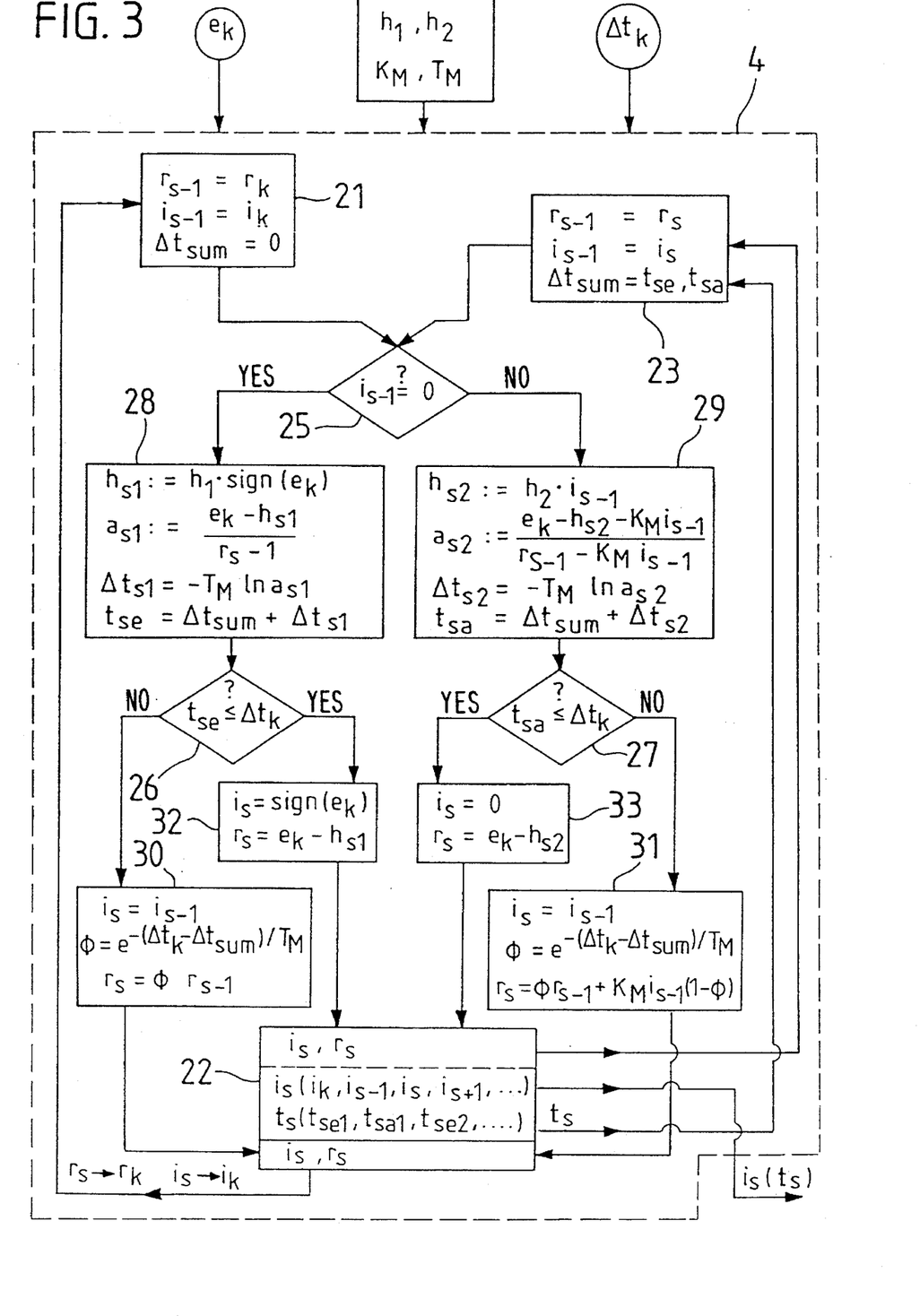
FIG. 3 is a schematic view of the operational or signal flow diagram of one embodiment of the invention.

FIG. 3 shows an operational diagram of a modulation process according to the invention by means of which a pseudo-rate modulator is implemented digitally. In the special hardware-type embodiment, data memories 21 to 23, comparators 25 to 27 and arithmetic units 28 to 33 provide the essential elements of a computing system (modulator 4) to carry out the process. For simplicity, structural elements, such as clock generators, arithmetic registers and storage cells in the arithmetic units are not shown separately.

At the start of each sampling period $\Delta t_k$, the input signal $e_k$ (k being the number of the k-th sampling period), which is constant during the duration of this sampling period, is present at the input of the modulator 4. This input signal triggers an operating cycle which consists of a number of computing cycles, each of which serves to determine a switching point within the sequence of switch-on and switch-off points ($t_{se}$ and $t_{sa}$, respectively) required in the sampling period $\Delta t_k$. Therefore, only as many computing cycles are executed as switch-on and switch-off points in time would occur in the case of an analog modulator with the same parameters ($\pm h_1$, $\pm h_2$, $K_M$, $T_M$), when the same input signal $e_k$ is applied. Generally, an additional computing cycle will be necessary to determine that the last computed switching point in time would already fall into the next sampling period $\Delta t_{k+1}$, and is thus no longer part of the current sequence.

The individual process steps take place as follows:

At the start of sampling period $\Delta t_k$, the following values are stored in a first data memory 21 as initial values (or as end conditions) from the operating cycle carried out during the preceding sampling period $\Delta t_{k-1}$:

$r_{s-1} = r_k$     the feedback signal of the modulator;

$i_{s-1} = i_k$     the present instantaneous output signal of the modulator corresponding to the switching condition OFF ($i = 0$) or ON ($i = \pm 1$); and $\Delta t_{sum} = 0$     an auxiliary quantity (with an initial value of 0) which represents the sum of all existing switch-on and switch-off time periods $\Delta t_s$ of a current operating cycle.

In a first comparator 25, it is determined whether $i_{s-1}=0$, or $i_{s-1} \neq 0$ (that is, $i_{s-1}=\pm 1$). In the former case, the first switch-on point (relative to the start of the sampling period $\Delta t_k$) $t_{se}$ is computed in a first arithmetic unit 28 as follows:

$$h_{s1} := h_1 \text{sign}(e_k) \quad (1)$$

$$a_{s1} := \frac{e_k - h_{s1}}{r_{s-1}}$$

$$\Delta t_{s1} = -T_M \ln a_{s1}$$
$$t_{se} = \Delta t_{sum} + \Delta t_{s1}$$

wherein $h_{s1}$ and $a_{s1}$ are auxiliary quantities; $\Delta t_{s1}$ is the time period to the switch-on point $t_{se}$; $h_1$ and $T_M$ are modulator parameters; and ln is the natural logarithm function.

Thereafter, it is determined in a second comparator 26 whether the switch-on point in time $t_{se}$ is still within the current sampling period $\Delta t_k$. If it is (YES), the values for the output signal $i_s$ as well as the feedback signal $r_s$ of the modulator at the switch-on point $t_{se}$ are computed in a third arithmetic unit 32 according to the following specification:

$$i_s = \text{sign}(e_k)$$

$$r_s = e_k - h_{s1} \quad (2)$$

The values for $t_{se}$, $i_s$ and $r_s$ which are formed as the end quantities of a first computing cycle within the current operating cycle, are stored in a second data memory 22.

Thus, the first switch-on point in time $t_{se}$, including the pertaining operational sign [sign($e_k$)!] is determined, and it must now be computed when the corresponding pulse must be switched off, which is performed as follows:

The state variables $i_s$ and $r_s$ are entered and stored in intermediate memory 23 (an initial-value memory for the computing cycle which follows), and in next computing cycle the quantities $r_{s-1}$, $i_{s-1}$ and $\Delta t_{sum}$ are used:

$$r_{s-1} = r_s$$

$$i_{s-1} = i_s$$

$$\Delta t_{sum} = t_{se} \quad (3)$$

At the start of the new computing cycle, it is determined in the first comparator 25 whether the output signal $i_{s-1}$ of the modulator corresponds to a switched-on or switched-off condition (that is, $i_{s-1}=\pm 1$, or $i_{s-1}=0$). Since a switch-on point was computed last, $i_{s-1} \neq 0$ will now apply so that the NO decision in comparator 25 now leads to the computation of the next switch-off point in time $t_{sa}$ in a second arithmetic unit 29, as follows:

$$h_{s2} := h_2 i_{s-1} \quad (4)$$

$$a_{s2} := \frac{e_k - h_{s2} - K_M i_{s-1}}{r_{s-1} - K_M i_{s-1}}$$

$$\Delta t_{s2} = -T_M \ln a_{s2}$$
$$t_{sa} = \Delta t_{sum} + \Delta t_{s2}$$

with the auxiliary quantities $h_{s2}$ and $a_{s2}$ as well as the modulator parameters $h_2$, $K_M$ and $T_M$, the duration of the switch-on time period $\Delta t_{s2}$ and the cumulative sum $\Delta t_{sum} = t_{se}$, $t_{sa}$ during all switch-on and switch-off time periods within the current operating cycle.

In a third comparator 27, it is then determined again whether the switch-off point $t_{sa}$ thus computed is still within the current sampling period $\Delta t_k$. If so (YES), the output and feedback signals $i_s$ and $r_s$ of the modulator at the switch-off point $t_{sa}$ are computed in a fourth arithmetic unit 33 according to the following specification:

$$i_s = 0$$

$$r_s = e_k - h_{s2} \quad (5)$$

These quantities, together with the value for the switch-off point $t_{sa}$, are entered and stored in the second data memory 22, and are also supplied again to the intermediate memory 23, so that the third computing cycle can start for the determination of the next switch-on point, particularly after a YES-decision ($i_{s-1}=i_s=0$) in the first comparator 25.

Subsequent switch-on and switch-off points which occur in the case of further YES-decisions in the second and third comparators 26 and 27 for the current sampling period $\Delta t_k$ are computed analogously to the above-explained method. After each further computing cycle, the value for $\Delta t_{sum}$ is raised by $\Delta t_{s1}$ and $\Delta t_{s2}$ respectively. In the second data memory 22, a sequence of switching points will therefore finally exist which can be indicated as follows by means of an additional continuous index: $t_{se1}$, $t_{sa1}$, $t_{se2}$, $t_{sa2}$, $t_{se3}$, $t_{sa3}$, etc.

At some point within the current operating cycle, caused by the continuous rise of $\Delta_{sum}$, the most recently computed switching point will no longer be within the applicable sampling period $\Delta t_k$, so that a NO-decision will be made in one of the two comparators 26 or 27. In the fifth and the sixth arithmetic units 30, 31, the state variables $i_s$ and $r_s$ must still be computed for the end of the current sampling period $\Delta t_k$, specifically by using a transition function $\phi$ as follows:

$$i_2 = i_{s-1}$$

$$\phi = e - (\Delta t_k - \Delta t_{sum}) \quad (6)$$

$$r_s = \phi r_{s-1}$$

where the last computed switching point which no longer falls into the sampling period $\Delta t_k$, was a switch-on point $t_{se}$ ($t_{se} > \Delta t_k$), or:

$$i_s = i_{s-1}$$

$$\phi = e^{-(\Delta t_k - \Delta t_{sum})} \quad (7)$$

$$r_s = \phi r_{s-1} + K_M i_{s-1}(1-\phi)$$

where the last computed point was a switch-off point $t_{sa}$ ($t_{sa} > \Delta t_k$). In the current sampling period $\Delta t_k$, the switching condition that was initiated at the previously computed switching point in time is maintained.

The quantities $i_s$ and $r_s$ calculated according to equations (6) and (7) above, which are valid for the end of the current operating cycle and thus also for the end of the sampling period $\Delta t_k$, are then read into the second data memory 22 and, at the start of the time interval $\Delta t_{k+1}$, which follows, are input as new initial values of amounts $i_k$ and $r_k$ in the first data memory 21.

For the switch-off and switch-on time periods $\Delta t_{s1}$ and $\Delta t_{s2}$ to be computed in the individual computing cycles, as well as for the transition functions $\phi$ which must finally be determined, the following approximation formulas may also be used:

$$\Delta t_{s1} = T_M \left( \frac{1}{a_{s1}} - 1 \right) \quad (8)$$

$$\Delta t_{s2} = T_M \left( \frac{1}{a_{s2}} - 1 \right)$$

$$\phi = \frac{T_M}{T_M + \Delta t_k - \Delta t_{sum}}$$

Use of these approximations, substantially reduces the computing expenditures. Particularly in the case of the transition function $\phi$, the computation of a transcendental exponential function can be based on simple basic operations.

At the end of the operating cycle which is completed very rapidly, relative to the duration of the pertaining real sampling period $\Delta t_k$, the second data memory 22, as the end memory 5 in FIG. 1, contains the modulation pulses which apply to this sampling period, in the form of a sequence of switch-on and switch-off points as well as pertaining operational signs of the pulses. This information is then emitted at the respective switching points as output signals representing positive or negative pulses of a constant amplitude ($i=\pm 1$) and variable pulse width and pulse frequency.

Figure 4A:
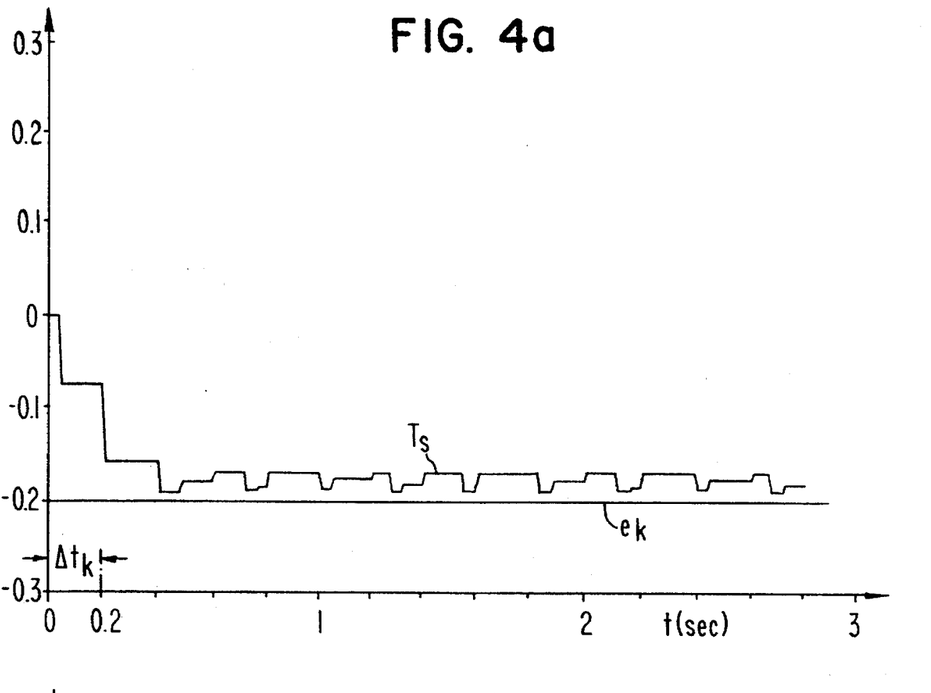
FIGS. 4a, b, and 5a, b show two examples of input signals $e_k$ and corresponding output pulse trains for a digitally implemented pseudo-rate modulator according to the invention.
Figure 4B:
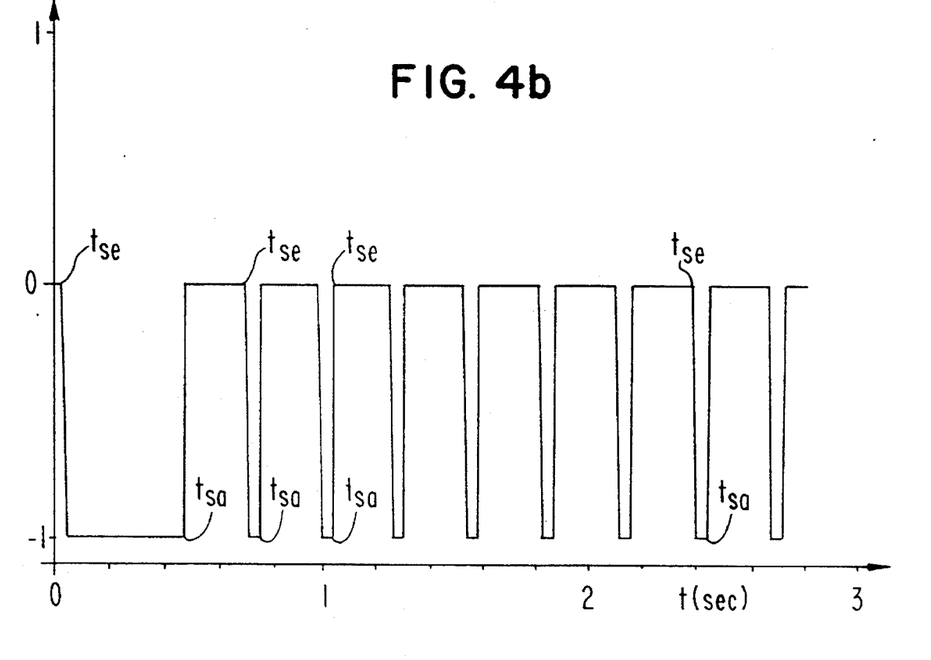
Figure 5A:
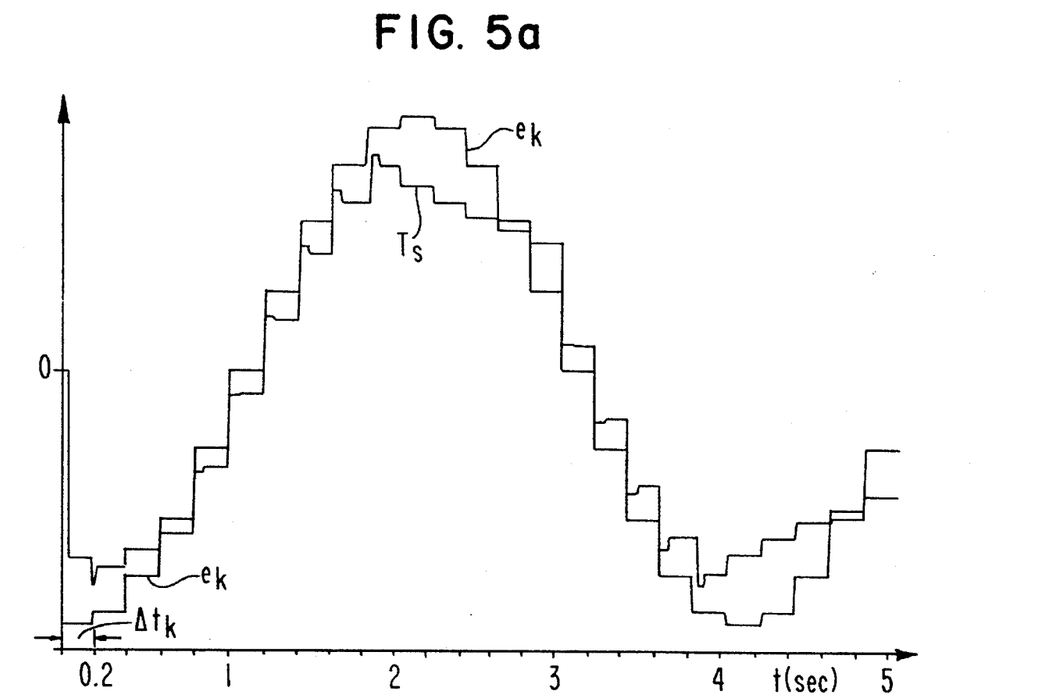
Figure 5B:
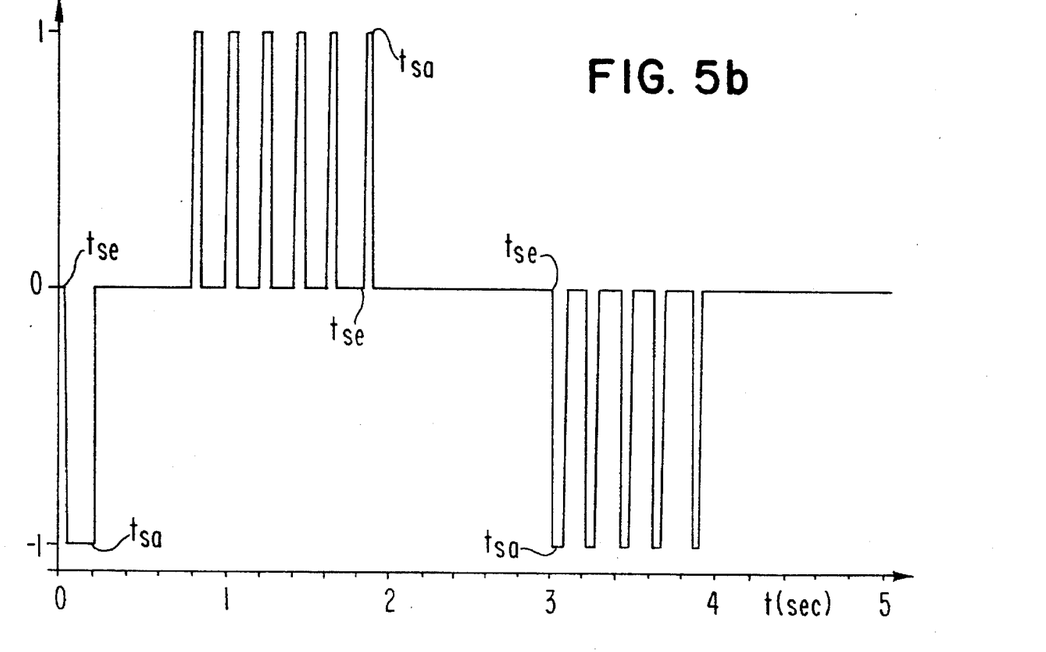

The operation of the digital modulator according to the invention is illustrated by the waveforms shown in FIGS. 4 and 5. In FIG. 4a a constant negative input signal $e_k$ and the corresponding modulator feedback signal $r_s$ are shown as functions of time t. In this example, the input signal is kept constant over many sampling periods $\Delta t_k$ each of which lasts for 0.2 sec. The modulator parameters are $T_M=2$ sec, $K_M=1$, $h_1=0.03$, $h_2=0.01$.

FIG. 4b shows the modulator output pulse train to be applied to the controlled device (for example the attitude control thrusters) in response to the constant negative input signal which, of course, causes only negative output pulses. On the abscissa the successive sampling periods $\Delta t_k$ of 0.2 sec duration each are marked, just as in FIG. 4a. The calculation time during the operation cycle at the beginning of each sampling period is about 0.01 sec and is not specifically shown. The switch-on and switch-off points $t_{se}$ and $t_{sa}$ are shown for each pulse. In the specific example shown there is only one switch-on point $t_{se}$ in the first sampling period, no switching in the second period, one switch-off point $t_{sa}$ in the third period, one switch-on and switch-off point each in the fourth period, etc. The switching points for each sampling period are calculated immediately after the beginning of every new sampling period.

FIG. 5a shows a sequence in which the input signal $e_k$ corresponds to a sine wave. The modulator parameters and time length of the sampling period $\Delta t_k$ are the same as in FIG. 4. The resulting modulator output pulse train is shown in FIG. 5b. In this specific case positive and negative output pulses are produced. The first sequence of positive pulses exhibits a phase advance relationship as compared to the maximum of the input signal train, just as is the case with the first sequence of negative output pulses and the corresponding input signal train minimum. This is typical for the behavior of a pseudo-rate modulator.

Based on the specific input parameters (modulator parameters, length of sampling interval ) in the foregoing examples, there are at most two switching points in any of the sampling periods. There may occur, of course, a larger number of switching points in the sampling periods if different conditions are applied.

In addition to the classical logic devices, such as flip-flops, AND-gates, OR-gates, memory registers, counters, and the like, highly integrated digital technologies may also be used to implement the digital modulation process according to the invention. In particular, a digital modulator may be constructed as a so-called ASIC; that is, an Application Specific Integrated Circuit. It may also be expedient to combine the functions and algorithms assigned to the individual arithmetic units in suitable groups and to supply them from common data memories with initial values and/or intermediately stored state variables. Thus, the principles, algorithms, storage and decision functions, which characterize the modulation process according to the invention, may be implemented in a single arithmetic unit or as a program routine in a central digital process computer.

According to another characteristic of the present invention, special care must be taken to assure that the systemic modulator parameters, such as switch-on and switch-off thresholds ($h_1$, $h_2$), modulator amplification ($K_M$) and delay time constants ($T_M$) are adaptable as a function of external signals or internal operating conditions of a superset control loop. This may be accomplished, for example, by providing that the mentioned parameters, during the switching-on of the modulation device or during the call of a subroutine that is equivalent to it from a read-only memory (ROM), are entered into a random access memory (RAM) to which by way of external data circuits, new values can be supplied in an adaptive manner, to replace the old ones. Thus, it is ensured that at the switch-on point, even when an external data input is absent, usable parameter values are always available which, although they do not ensure an optimal behavior of the pertaining superset control loop or process, at least ensure proper functioning.

By means of this adaptability of the system, the optimal operating condition can always be adjusted, either when a system which contains a digital modulator according to the invention is started, or when operating conditions change and deviations of the system parameters from their nominal values take place. Thus, for example, the efficiency and the service life of reaction jets depend on the extent of the minimal pulse duration which, in turn, can be varied by means of the above-mentioned modulator parameters ($h_1$, $h_2$, $K_M$, $T_M$). Correspondingly, the above-mentioned lead effect can also be influenced by way of these parameters.

Finally, it is necessary to determine the maximum number of computing cycles required for the calculation of all switch-on and switch-off points in order to determine the switching conditions during the whole duration of a given time or sampling period $\Delta t_k$. This is important because the readout process of the computed pulse sequence cannot start before its determination is completely concluded, and the sequence control of digital operations takes place within a fixed time frame. Using the already introduced terms, the shortest pulse sequence period of a pseudo-rate modulator is determined by the relationship:

$$T_{min} = 4T_M (h_1 - h_2)/K_M \qquad (9)$$

The number of switching conditions in a given time period $\Delta t_k$ therefore will not exceed the next integer below the value $2\Delta t_k/T_{min}$.

The computing step for the transition of the internal modulator state variables at the end of the sampling period must then still be added to the thus determinable number of computing cycles for the determination of the switching conditions.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. A digital modulation process for converting an input signal comprising a time variable series of sampling values, each of which sampling values remains constant within a fixed constant sampling period, into output signals representing for each sampling period a sequence of pulses having a constant amplitude and a variable pulse width and frequency, said process comprising the steps of:

entering the input signal into a data processor;

entering modulator parameter values into said data processor;

processing said input signal and said modulator parameter values in said data processor to determine, directly in a single operating cycle at the beginning of each sampling period $t_k$, a sequence of switch-on and switch-off points $t_{se}$, $t_{sa}$ and the positive or negative sign of each pulse within the sequence of pulses for the same sampling period $\Delta t_k$.

2. A process according to claim 1, wherein for implementing of a pseudo-rate modulator, the switch-on points $t_{se}$ within a particular time interval $\Delta t_k$ are determined according to the following equation:

$$t_{se} = \Delta t_{sum} - T_M \ln \left[ \frac{e_k - h_1 \text{sign}(e_k)}{r_{s-1}} \right]$$

wherein $e_k$ is a sampled value of the input signal during a k-th time interval; $h_1$ is a switch-on threshold of a modulator hysteresis; $T_M$ is a time constant in a feedback branch of the modulator; $r_{s-1}$ is an internal feedback signal of a preceding switch-off point $t_a$; and $\Delta t_{sum}$ is a cumulative sum of switch-on and switch-off intervals for a current time interval $\Delta t_k$, in each case situated between switch-on and switch-off points, and between switch-off and switch-on points.

3. A process according to claim 2, wherein for implementing of a pseudo-rate modulator, the switch-off points $t_{sa}$ within a particular sampling period $\Delta t_k$ are determined according to the following equation:

$$t_{sa} = \Delta t_{sum} - T_M \ln \left[ \frac{e_k - (h_2 + K_M)i_{s-1}}{r_{s-1} - K_M i_{s-1}} \right]$$

wherein $e_k$ is a sampling value of the input signal during a k-th sampling period; $h_2$ is a switch-off threshold of a modulator hysteresis; $T_M$ is a time constant in a feedback branch of the modulator; $r_{s-1}$ is an internal feedback signal of a preceding switch-on point $t_{se}$; $K_M$ is an amplification factor in said feedback branch; $i_{s-1}$ is a preceding switching condition; and $\Delta t_{sum}$ is a cumulative sum of switch-on and switch-off intervals for a current sampling period $\Delta t_k$, in each case situated between switch-on and switch-off points, and between switch-off and switch-on points.

4. A process according to claim 3, wherein the determination of the sequence of switch-on and switch-off points $t_{se}$ and $t_{sa}$ for a particular time interval $\Delta t_k$ is terminated when a cumulative sum $\Delta t$ of all switch-on and switch-off intervals $\Delta t_{se}$ and $\Delta t_{sa}$ within the time interval $\Delta t_k$ exceeds known length of the time interval.

5. A process according to claim 1, wherein for implementing of a pseudo-rate modulator, the switch-off points $t_{sa}$ within a particular sampling period $\Delta t_k$ are determined according to the following equation:

$$t_{sa} = \Delta t_{sum} - T_M \ln \left[ \frac{e_k - (h_2 + K_M)i_{s-1}}{r_{s-1} - K_M i_{s-1}} \right]$$

wherein $e_k$ is a sampling value of the input signal during a k-th sampling period; $h_2$ is a switch-off threshold of a modulator hysteresis; $T_M$ is a time constant in a feedback branch of the modulator; $r_{s-1}$ is an internal feedback signal of a preceding switch-on point $t_{se}$; $K_M$ is an amplification factor in said feedback branch; $i_{s-1}$ is a preceding switching condition; and $\Delta t_{sum}$ is a cumulative sum of switch-on and switch-off intervals for a current sampling period $\Delta t_k$, in each case situated between switch-on and switch-off points, and between switch-off and switch-on points.

6. A process according to claim 5, wherein the determination of the sequence of switch-on and switch-off points $t_{se}$ and $t_{sa}$ for a particular time interval $\Delta t_k$ is terminated when a cumulative sum $\Delta t_{sum}$ of all switch-on and switch-off intervals $\Delta t_{se}$ and $\Delta t_{sa}$ within the time interval $\Delta t_k$ exceeds known length of the time interval.

7. A process according to claim 1, wherein for implementing of a pseudo-rate modulator, the switch-on points $t_{se}$ within a particular sampling period $\Delta t_k$ are determined according to the following equation:

$$t_{se} = \Delta t_{sum} + T_M \left( \frac{r_{s-1}}{e_k - h_1 \text{sign}(e_k)} - 1 \right)$$

wherein $e_k$ is a sampling value of the input signal during a k-th sampling period; $h_1$ is a switch-on threshold of a modulator hysteresis; $T_M$ is a time constant in a feedback branch of the modulator; $r_{s-1}$ is an internal feedback signal of a preceding switch-off point $t_{sa}$; and $\Delta t_{sum}$ is a cumulative sum of switch-on and switch-off intervals for a current sampling period $\Delta t_k$, in each case situated between switch-on and switch-off points, and between switch-off and switch-on points.

8. A process according to claim 7, wherein for implementing of a pseudo-rate modulator, the switch-off points $t_{sa}$ within a particular sampling period $\Delta t_k$ are determined according to the following equation:

$$t_{sa} = \Delta t_{sum} - T_M \left( \frac{r_{s-1} - K_M i_{s-1}}{e_k - (h_2 + K_M) i_{s-1}} - 1 \right)$$

wherein $K_M$ is an amplification factor in the feedback branch of the modulator; $i_{s-1}$, preceding switching condition; and $h_2$ is a switch-off threshold of the modulator hysteresis.

9. A process according to claim 1, wherein for implementing of a pseudo-rate modulator, the switch-off points $t_{sa}$ within a particular sampling period $\Delta t_k$ are determined according to the following equation:

$$t_{sa} = \Delta t_{sum} - T_M \left( \frac{r_{s-1} - K_M i_{s-1}}{e_k - (h_2 + K_M) i_{s-1}} - 1 \right)$$

wherein $e_k$ is a sampling value of the input signal during a k-th sampling period; $h_2$ is a switch-off threshold of a modulator hysteresis; $T_M$ is a time constant in a feedback branch of the modulator; $r_{s-1}$ is an internal feedback signal of a preceding switch-on point $t_{se}$; $K_M$ is an amplification factor in said feedback branch; $i_{s-1}$ is a preceding switching condition; and $\Delta t_{sum}$ is a cumulative sum of switch-on and switch-off intervals for a current sampling period $\Delta t_k$, in each case situated between switch-on and switch-off points, and between switch-off and switch-on points.

10. A process according to claim 1, wherein the determination of the sequence of switch-on and switch-off points $t_{se}$ and $t_{sa}$ for a particular time interval $\Delta t_k$ is terminated when a cumulative sum $\Delta t_{sum}$ of all switch-on and switch-off intervals $\Delta t_{se}$ and $\Delta t_{sa}$ within the time interval $\Delta t_k$ exceeds known length of the time interval.

11. A process according to claim 10, wherein a feedback signal $r_s$ assigned to an end point of a particular sampling period $\Delta t_k$ ending in a switched-off condition is generated according to one of the following equations:

$$r_s = r_{s-1} \exp \left( -\frac{\Delta t_k - \Delta t_{sum}}{T_M} \right)$$

and $$r_s = \frac{r_{s-1} T_M}{T_M + \Delta t_k - \Delta t_{sum}}$$

wherein $r_{s-1}$, is an internal feedback signal of a preceding switch-on point; and $T_M$ is a time constant in a feedback branch of the modulator.

12. A process according to claim 10, wherein a feedback signal $r_s$ assigned to an end point of a particular sampling period $\Delta t_k$ ending in a switched-on condition is generated according to one of the following equations:

$$r_s = (r_{s-1} - K_M i_{s-1}) \exp \left( -\frac{t_k - \Delta t_{sum}}{T_M} \right) + K_M i_{s-1}$$

and $$r_s = \frac{T_M (r_{s-1} - K_M i_{s-1})}{T_M + \Delta t_k - \Delta t_{sum}} + K_M i_{s-1}$$

wherein, $r_{s-1}$ is an internal feedback signal of a preceding switch-off point; $T_M$ is a time constant of a feedback branch of the modulator; $i_{s-1}$ is a preceding switching condition; and $K_M$ is an amplification factor in said feedback branch.

13. A digital modulator for converting an input signal comprising a time variable series of sampling values, each of which sampling values remains constant within a fixed constant sampling period, into output signals representing for each sampling period a sequence of pulses having a constant amplitude and a variable pulse width and pulse frequency, said modulator comprising:

a data processor;

means for inputting desired modulator parameter values into said data processor;

means for inputting said input signal into said data processor;

said data processor comprising means for processing said input signals and said modulator parameter values and for determining, directly in a single operating cycle at the beginning of each sampling period $\Delta t_k$, a sequence of switch-on and switch-off points, $t_{se}$ and $t_{sa}$ respectively, for said output sequence of pulses; and said data processor further comprising means for determining an operating sign for each of said switch-on points;

said determination of switch-on and switch-off points and said determining of operating signs being performed directly in one single operating cycle for each sampling period $\Delta t_k$.

14. A digital modulator for generating output signals representing a sequence of pulses of a constant amplitude and variable pulse width and frequency for the control of discretely operating control elements which operate on a controlled system as a function of an input signal which comprises a time-variable series of fixed constant sampling values, each of which sampling values remains constant during a fixed sampling period, and which input signal is indicative of a deviation of the controlled system from predetermined parameters, said modulator, comprising:

a data processor having arithmetic units, memories, comparators and means for receiving modulator parameters and said input signal;

said data processor comprising means for processing said input signals and said modulator parameter values and for determining, directly in a single operating cycle at the beginning of each sampling period $\Delta t_k$, a sequence of switch-on and switch-off points, $t_{se}$ and $t_{sa}$ respectively, for said output sequence of pulses; and said data processor further comprising means for determining an operating sign for each of said switch-on points;

said determination of switch-on and switch-off points and said determining of operating signs being performed directly in one single operating cycle for each sampling period $\Delta t_k$.

15. A control arrangement comprising:

at least one measuring unit for determining actual values of at least one controlled variable;

a controller for determining deviation of said at least one controlled variable from a predeterminable desired value and for generating error signals comprising a time variable series of sampling values, each of which sampling values remains constant during a fixed sampling period;

a digital modulator which receives the error signals as input signals and generates output signals representing a sequence of pulses of a constant amplitude and a variable pulse width and frequency; and at least one control device which is controlled by output signals of the digital modulator and acts upon a controlled system for influencing said at least one controlled variable, by emitting discrete control pulses;

wherein said digital modulator has:

means for receiving desired modulator operating parameters;

means for receiving said input signal;

means for processing said input signal and said modulator parameters and for determining a sequence of switch-on and switch-off points, $t_{se}$ and $t_{sa}$ respectively, for said output sequence of pulses; and means for determining an operating sign for each of said switch-on points;

said determination of switch-on and switch-off points and said determining of operating signs being performed directly in one single operation for each sampling period $\Delta t_k$.

16. A digital modulation process for converting an input signal comprising a time variable series of sampling values, each of which sampling values remains constant within a fixed sampling period, into output signals representing a sequence of pulses having a constant amplitude and a variable pulse width and frequency, said process comprising the steps of:

first, processing said input signal in a data processor to determine a series of switch-on and switch-off signals indicative of switch-on and switch-off points of said output sequence of pulses;

second, determining an operating sign for pulses in said output signal for each of said switch-on points; and third, outputting said sequence of pulses having respective switch-on and switch-off times and operating signs according to results of said first and second steps;

wherein said first and second steps are performed directly in one single operation.

* * * * *